United States Patent
Horie et al.

Patent Number: 5,742,198
Date of Patent: Apr. 21, 1998

[54] WAVEFORM SHAPING APPARATUS

[75] Inventors: Masakiyo Horie, Toyohashi; Takuya Harada, Kariya, both of Japan

[73] Assignee: Nippondenso Co., Ltd., Kariya, Japan

[21] Appl. No.: 687,915

[22] Filed: Jul. 29, 1996

[30] Foreign Application Priority Data

Jul. 28, 1995 [JP] Japan ................... 7-193262

[51] Int. Cl.$^6$ .................................. H03B 1/00
[52] U.S. Cl. .................. 327/551; 327/100; 327/165; 324/76.62; 324/169
[58] Field of Search .................. 327/100, 78, 79, 327/89, 205, 206, 551, 552, 165; 324/76.47, 76.48, 76.62, 169, 170

[56] References Cited

U.S. PATENT DOCUMENTS

| | | | |
|---|---|---|---|
| 4,155,037 | 5/1979 | Mazur | 324/111 |
| 5,357,147 | 10/1994 | Ina et al. | 327/100 |
| 5,548,242 | 8/1996 | Yasuda et al. | 327/551 |
| 5,576,658 | 11/1996 | Hushimi et al. | 327/100 |
| 5,631,585 | 5/1997 | Kinoshita et al. | 327/100 |

FOREIGN PATENT DOCUMENTS

| | | |
|---|---|---|
| 54-004158 | 1/1979 | Japan. |
| 62-231516 | 10/1987 | Japan. |
| 5-010197 | 1/1993 | Japan. |

*Primary Examiner*—Margaret Rose Wambach
*Assistant Examiner*—Kenneth B. Wells
*Attorney, Agent, or Firm*—Cushman Darby & Cushman IP Group of Pillsbury Madison & Sutro LLP

[57] ABSTRACT

An input voltage Va and a threshold voltage Vc are compared in a comparator 21 to shaping the waveform of a sensor signal. The period of the output signal of comparator 21 is measured by a period measuring circuit 4. A stepped waveform voltage generating circuit 5 generates a stepped waveform voltage based on the measured period. The stepped waveform voltage is converted into corresponding current in a V-I conversion circuit 6. The current of V-I conversion circuit 6 is supplied to a resistance 23d or 23e via an analog switch 22a or 22b which turns on or off in response to the operation of comparator 21, thereby applying a stepped offset voltage to input voltage Va threshold voltage Vc to perform the hysteresis operation.

19 Claims, 10 Drawing Sheets

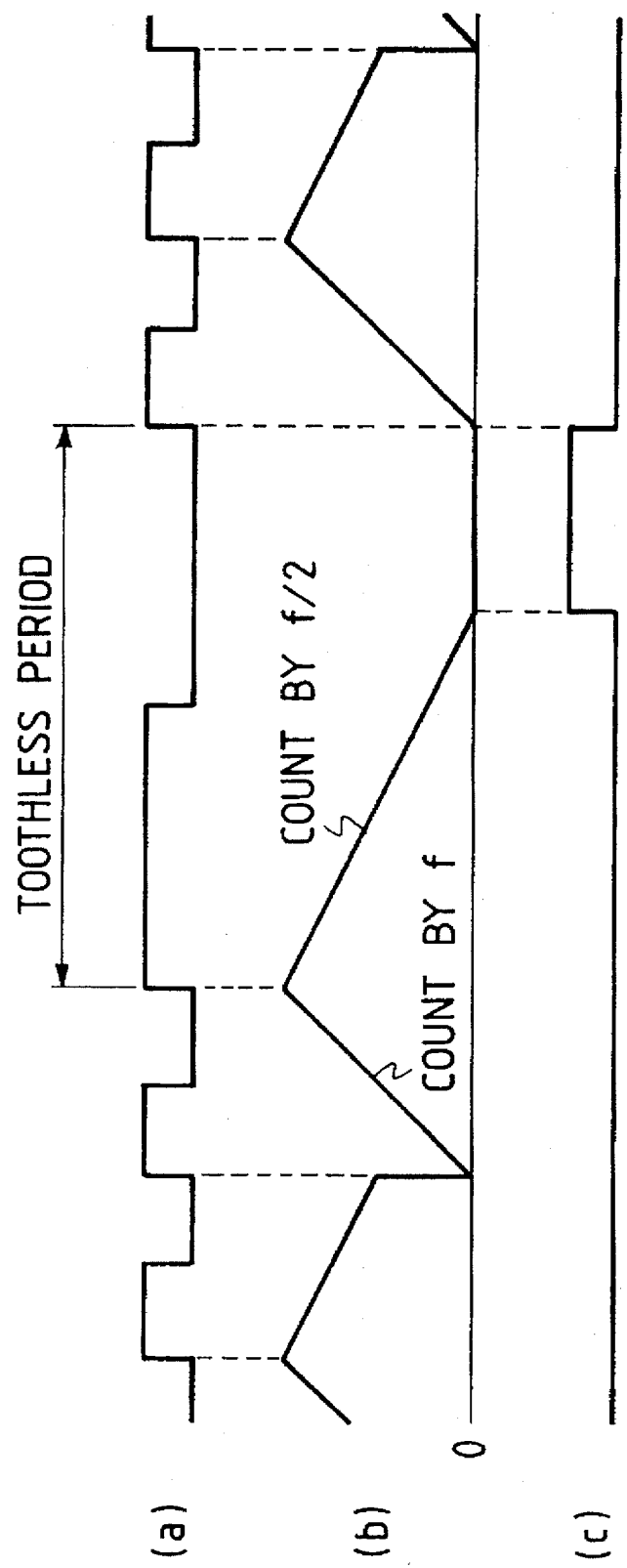

WAVEFORM SHAPING APPARATUS

BACKGROUND OF THE INVENTION

1. Field of the Invention

This invention relates to a waveform shaping apparatus for shaping the waveform of the sensor signal obtained from an electromagnetic pickup coil or the like.

2. Related Art

In the control of an automotive vehicle or the like, it is well known that a rotational speed sensor, such as an engine speed sensor or a crank angle sensor, basically comprises an electromagnetic pickup coil or its equivalents disposed in confronting relationship to the teeth of a rotary gear. In a conventional apparatus for shaping the waveform of this kind of sensor signal, it was usual that the input sensor signal was compared with a predetermined threshold voltage in a comparator to shape the waveform thereof.

In many cases, the sensor signal contains the noise component such as ignition noise. Hence, it is routinely performed to set a hysteresis to the sensor signal or the threshold voltage. For example, a predetermined voltage applied to the sensor signal or the threshold voltage for a predetermined time in response to the operation of the comparator.

However, in view of the performance of the circuit, applying such a predetermined voltage for a predetermined time is not desirable because significant noise is generated in the falling transition of the pulsative voltage applied.

To eliminate this kind of noise and to accurately and responsively operate the comparator, there is proposed a technology disclosed in Unexamined Japanese Patent Application No. SHO 62-231516, published in 1987. According to this technology, a predetermined voltage is applied to a sensor signal or a threshold voltage in response to the operation of a comparator, while the applied voltage is gradually reduced with elapsing time to prevent the above-described noise from generating. More specifically, the capacitor is charged or discharged in response to the operation of the comparator to produce a sawtooth waveform voltage by using this charge/discharge voltage. Thus produced sawtooth waveform voltage is applied to the sensor signal or the threshold. voltage.

However, according to the above-described prior art, the frequency of the input signal is analog F-V converted and then the capacitor is charged or discharged by a constant current corresponding to the converted voltage to produce the sawtooth voltage. Hence, the magnitude and gradient of the sawtooth offset voltage of the comparator are inherently subjected to the dispersion of circuit constants or the adverse effect of temperature characteristics; therefore, there was a problem that both the voltage accuracy and the time accuracy were undesirably deteriorated.

In addition, if the above-described circuit is constituted by a CMOS transistor, it was difficult to constitute a diode. Therefore, it was impossible to simply replace the above-describe circuit by the CMOS transistor from the reason that the accuracy of the current-mirror circuit is inferior to that of the bipolar.

SUMMARY OF THE INVENTION

Accordingly, in view of above-described problems encountered in the related art, a principal object of the present invention is to provide a novel and excellent waveform shaping apparatus capable of enhancing both the voltage accuracy and time accuracy in the above-described hysteresis operation by adopting a digital arrangement for the essential components of the apparatus.

In order to accomplish this and other related objects, a first aspect of the present invention provides a waveform shaping apparatus comprising: a comparing means (21) for comparing a sensor signal with a threshold signal to generate an output signal whose waveform is shaped; a clock signal generating means (4, 51–54) for generating a clock signal having a period proportional to a period of the output signal of the comparing means; a counting means (55), initialized in synchronism with a change of the output signal of the comparing means, for performing a counting operation of the clock signal generated from the clock signal generating means; and an offset means (56, 6, 22a, 22b, 23d, 23e) for producing an offset signal attenuating in a stepwise fashion from a predetermined signal level in accordance with the counting operation of the counting means, and adding the offset signal to either the sensor signal or the threshold signal when the sensor signal crosses a signal level of the threshold signal, so as to increase a difference between a level of the sensor signal and a level of the threshold signal.

Furthermore, a second aspect of the present invention provides a waveform shaping apparatus comprising: a comparing means (21) for comparing a sensor signal with a threshold signal to generate an output signal whose waveform is shaped; a clock signal generating means (4, 51–54) for generating a clock signal having a period proportional to the output signal of the comparing means; a counting means (55), initialized in synchronism with a change of the output signal of the comparing means, for performing a counting operation of the clock signal generated from the clock signal generating means; and an offset means (56, 6, 22a, 22b, 23d, 23e) for producing an offset signal varying in a stepwise fashion from a predetermined signal level in accordance with the counting operation of the counting means, and increasing a signal level of the sensor signal when the sensor signal exceeds the threshold signal while increasing a signal level of the threshold signal when the sensor signal falls below the threshold signal.

According to features of the preferred embodiment of the present invention, the offset means comprises a voltage conversion means (56) for converting a count value of the counting means into corresponding voltage, to produce the offset signal based on the corresponding voltage. The clock signal generating means comprises a period measuring means (4) for measuring the period of the output signal of the comparing means, and a dividing means (51–54) for generating the clock signal by dividing a reference clock based on the period measured by the period measuring means.

Moreover, a third aspect of the present invention provides a waveform shaping apparatus comprising: a comparing means (21) for comparing a sensor signal with a threshold signal to generate an output signal whose waveform is shaped; a period measuring means (4) for measuring a period of the output signal of the comparing means to generate a measured period; and an offset means (5, 6, 22a, 22b, 23d, 23e) for producing an offset signal attenuating in a stepwise fashion, the time of each step being proportional to the measured period of the output signal of the comparing means, so as to decrease from a predetermined signal level which is set in synchronism with a change of the output signal of the comparing means, and adding the offset signal to either the sensor signal or the threshold signal when the sensor signal crosses a signal level of the threshold signal, so as to increase a difference between the sensor signal and the threshold signal.

According to the features of the preferred embodiments of the present invention, the period measuring means comprises an edge detecting means (41) for detecting an edge of the output signal of the comparing means, and a time measuring means (42) for measuring a time interval between a previous edge detecting time and a present edge detecting time in response to each edge detection by the edge detecting means. The period measuring means further comprises an average output means (43a, 43b, 45) for averaging a plurality of latest measuring data measured by the time measuring means to generate the measured period. The waveform shaping apparatus further comprises a frequency-voltage conversion means (8) for generating a voltage corresponding to a frequency of the output signal of the comparing means based on the measured period, and a threshold signal changing means (9, 22c) for increasing the signal level of the threshold signal the voltage corresponding to the frequency when the sensor signal is smaller than the threshold signal. And, the sensor signal is generated in response to a rotation of a toothed gear, a toothless region detecting means (100) is provided for detecting a toothless region of the toothed gear based on the output signal of the comparing means, and a prohibiting means (110–112) is provided for prohibiting a renewal of the measured period based on a momentary output of the comparing means when the toothless region is detected by the toothless region detecting means.

In the foregoing description, reference numerals in parentheses respectively represent the corresponding components in the preferred embodiments of the present invention described hereinafter.

With the above-described digital arrangement, the present invention produces the offset signal varying in a stepwise fashion based on the output signal of the comparing means for comparing the sensor signal with the threshold signal. The signal level of either the sensor signal or the threshold signal is changed by the offset signal. Accordingly, it becomes possible to accurately and stably performing the comparing operation without causing any noise derived from the sudden change of the hysteresis voltage, as well as enhancing the accuracy of the hysteresis operation in the comparing means.

BRIEF DESCRIPTION OF THE DRAWINGS

The above and other objects, features and advantages of the present invention will become more apparent from the following detailed description which is to be read in conjunction with the accompanying drawings, in which:

FIG. 11 is a timing chart showing an operation of the circuit shown in FIG. 10.

DETAILED DESCRIPTION OF THE PREFERRED EMBODIMENTS

Figure 1:
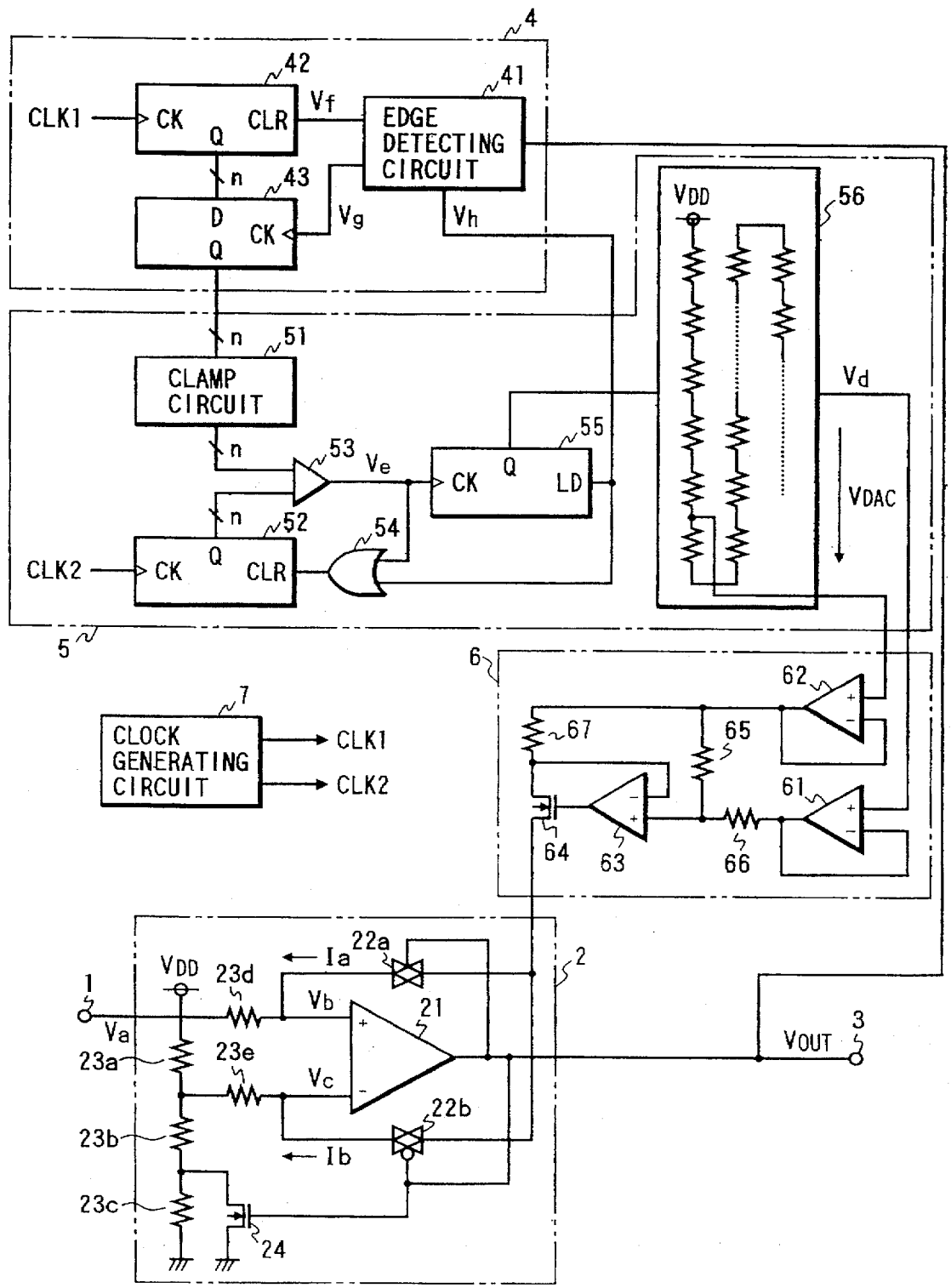
FIG. 1 is a schematic diagram showing a circuit arrangement of a first embodiment of the present invention.

Preferred embodiments of the present invention will be explained in greater detail hereinafter, with reference to the accompanying drawings. Identical parts are denoted by the same reference numerals throughout views.

First Embodiment

FIG. 1 is a schematic diagram showing a waveform shaping apparatus of a first embodiment of the present invention.

This waveform shaping apparatus has a function of shaping the waveform of a sensor signal (AC voltage) obtained from an engine speed sensor or a crank angle sensor of an automotive vehicle. These sensors are respectively constituted by an electromagnetic pickup coil. The sensor signal of this kind of electromagnetic pickup coil, after passing through a noise removal filter, enters into the waveform shaping apparatus through an input terminal 1.

The sensor signal entered through input terminal 1, i.e. input voltage Va, is compared with a predetermined threshold voltage in a comparator circuit 2. An output terminal 3 of comparator circuit 2 generates a waveform-shaped signal. This output signal is sent to an ECU (Engine Control Unit, not shown), to produce an effective edge from the build-up of this signal as a reference for determining the ignition timing in the ECU.

Comparator circuit 2 comprises a comparator 21, analog switches 22a and 22b, resistances 23a through 23e, and a transistor 24. Analog switches 22a and 22b selectively turn ON or OFF in response to the output of comparator 21. Transistor 24 is turned ON when the output of comparator 21 is a High level. Resistances 23a through 23c cooperatively produce the required threshold voltage.

This comparator circuit 2 performs a comparing operation with a hysteresis. More specifically, when input voltage Va is increased, the output of comparator 21 is turned to the High level. In response to this High level output, analog switch 22a is turned ON. Hence, a later-described offset current Ia flows through resistance 23d, and therefore a noninverting input terminal voltage Vb of comparator 21 is increased. Furthermore, transistor 24 is turned ON to short-circuit the resistance 23c, thereby reducing an inverting input terminal voltage Vc.

On the contrary, when input voltage Va is reduced, the output of comparator 21 is turned to a Low level. In response to this Low level output, analog switch 22b is turned ON. Hence, a later-described offset current Ib flows through resistance 23e, and therefore inverting input terminal voltage Vc of comparator 21 is increased. Furthermore, transistor 24 is turned OFF to release the shortcircuit of resistance 23c, thereby increasing the inverting input terminal voltage Vc.

Next, the circuit arrangement for generating the offset currents Ia and Ib will be described hereinafter.

The circuit of this embodiment comprises a period measuring circuit 4 which measures the period of the output signal of comparator circuit 2, a stepped waveform voltage generating circuit 5 which generates a stepped waveform voltage based on the period measured by period measuring circuit 4, a V-I conversion circuit 6 which converts the stepped voltage, produced by stepped waveform voltage generating circuit 5, into the offset currents Ia and Ib, and a clock generating circuit 7 which generates clock signals CLK1 and CLK2 required for activating period measuring circuit 4 and stepped waveform voltage generating circuit 5.

Period measuring circuit 4 comprises an edge detecting circuit 41 which detects a rising edge and a falling edge of the output signal of comparator circuit 2, a counter 42 which counts the clock CLK1 generated from clock generating circuit 7, and a D-type flip-flop (D-F/F) 43 of n bits which holds the count value.

Edge detecting circuit 41 causes n-bit D-F/F 43 to hold the count value of counter 42 in response to every detection of the rising edge of the output signal of comparator circuit 2, and thereafter clears the count value of counter 42. More specifically, D-F/F 43 holds the count value between neighboring rising edges of the output signal of comparator circuit 2. In other words, D-F/F 43 holds the value representing the period of the output signal of comparator 2.

Stepped waveform voltage generating circuit 5 comprises a clamp circuit 51 for clamping the count value held by D-F/F 43, a counter 52 for counting clock CLK2 sent from clock generating circuit 7, a comparator 53 for comparing the digital output data of clamp circuit 51 with the digital count value of counter 52, an OR circuit 54 for clearing counter 52 in response to the output signal of comparator 53 or the rising/falling edge detecting signal of edge detecting circuit 41, a counter 55 of m bits for counting the output pulses of comparator 53, and a D/A converter 56 for outputting a voltage representing the count value counted by counter 55.

Clamp circuit 51 clamps the count value held by D-F/F 43 in a given range defined by predetermined upper-limit and lower-limit values, taking account of the reliability of the sensor characteristics and the later-described counting performance of counter 55. The upper-limit and lower-limit values correspond to two different frequencies for clamping the frequency of the output signal of comparator circuit 2.

Counter 52 counts clock CLK2 sent from clock generating circuit 7. Comparator 53 compares the count value of counter 52 with the output value of clamp circuit 51, and generates a High-level signal every time the count value reaches the output value of clamp circuit 51, and then clears counter 52 through circuit 54. Accordingly, comparator 53 outputs a clock signal every time the count value of counter 52 reaches the output value of clamp circuit 51. The period of this clock signal is proportional to the period measured by period measuring circuit 4, and is hence proportional to the period of the output signal of comparator circuit 4.

Counter 52 is also cleared by the rising/falling edge detecting signal fed from edge detecting circuit 41, because the offset current generating operation is started in synchronism with the level inversion of the output signal of comparator circuit 2.

Counter 55 is loaded (LD) a preset value in response to the rising/falling edge detecting signal fed from edge detecting circuit 41, and performs the up-counting operation in response to the clock signal generated from comparator 53.

D/A converter 56, constituted by a resistance ladder, generates an output voltage Vd representing the count value of counter 55, and also generates a reference voltage taken out from a stationary tap in the ladder resistance. A voltage ($V_{DAC}$), obtained by subtracting output voltage Vd from the reference, voltage, is converted into a corresponding current value in V-I conversion circuit 6.

V-I conversion circuit 6 comprises two buffers 61 and 62, an operational amplifier 63, a transistor 64, and resistances 65 to 67. Current flowing through transistor 64 is expressed by $V_{DAC} \cdot R1/\{R3 \cdot (R1+R2)\}$, where R1, R2 and R3 represent the resistance values of resistances 65, 66 and 67 respectively. This current serves as the above-described offset currents Ia and Ib which respectively flows through resistance 23d or 23e to generate the offset voltage for changing the input voltage or the threshold voltage.

The reason why the reference voltage is taken out from the stationary tap in D/A converter 56 is that buffers 61 and 62 and operational amplifier 63 in V-I conversion circuit 6 use the electric power source of $V_{DD}$ and it is usually impossible for an ordinary operational amplifier to increase its output voltage up to the electric power source voltage, and hence the maximum voltage is set to a tap voltage which is lower than $V_{DD}$ by an amount of voltage required for the dynamic range of the operational amplifier.

Next, the operation of the above-described circuit will be explained with reference to the timing chart shown in FIG. 2.

When input voltage Va increases and crosses the level of the threshold voltage Vc, the output of comparator $V_{OUT}$ is turned from a Low level (hereinafter abbreviated by "L") to a High level (hereinafter abbreviated by "H") as shown by the waveform. (h) of FIG. 2 and outputs Vf, Vg and Vh of edge detecting circuit 41 become "H" for a predetermined time as shown by the waveforms (f) and (g) of FIG. 2.

Figure 2:
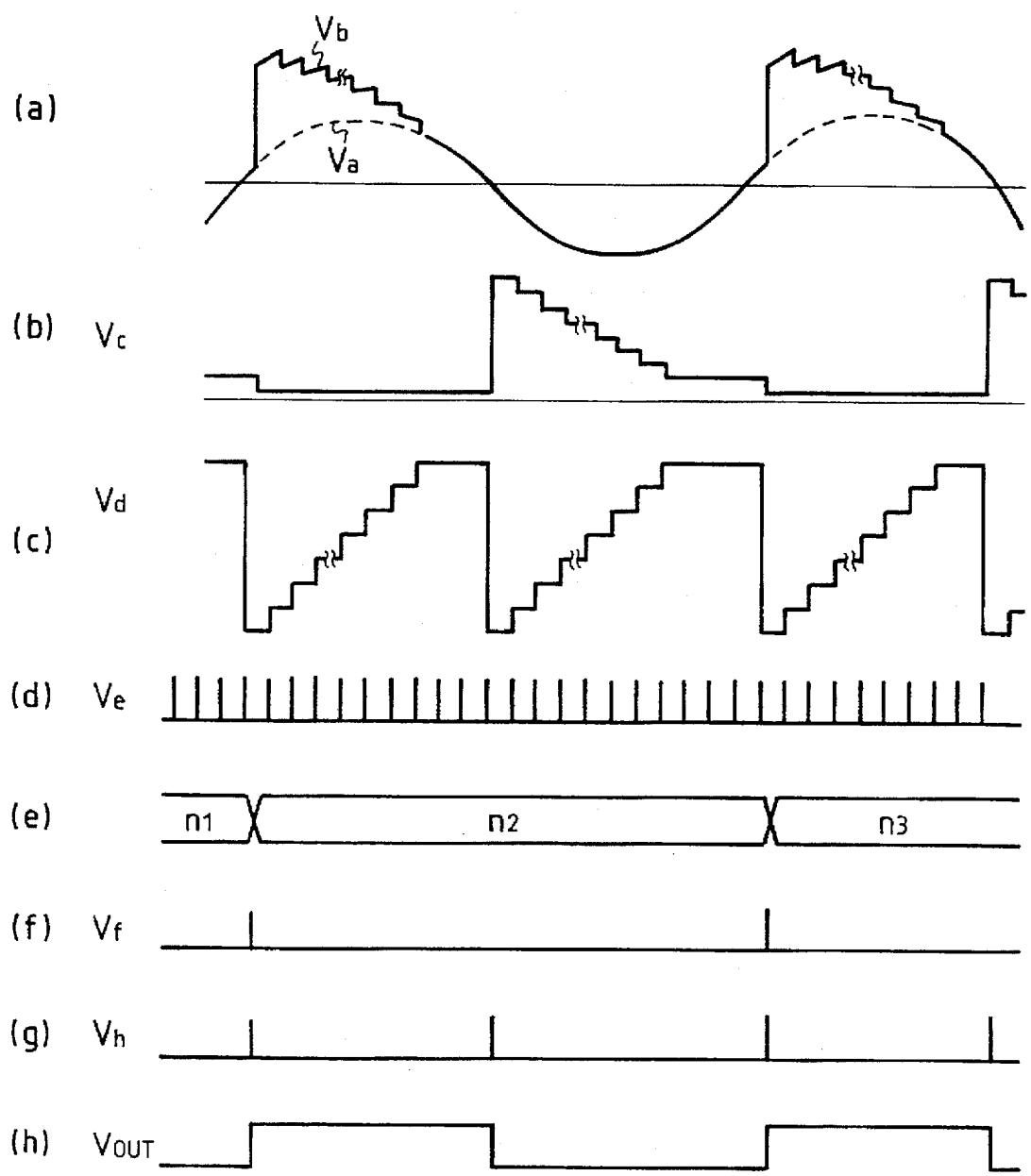
FIG. 2 is a timing chart showing an operation of the first embodiment of the present invention.

In response to this change, counter 55 is loaded a predetermined amount and the output voltage Vd of D/A converter 56 is reduced to a predetermined voltage as shown by the waveform (c) of FIG. 2. Furthermore, the count value of counter 42 is held in D-F/F 43 and counter 42 is cleared. The count value, held in D-F/F 43 as shown by the waveform (e) of FIG. 2, is output through clamp circuit 51.

Meanwhile, in response to the output "H" of comparator analog switch 22a is turned ON and the noninverting input terminal voltage Vb of comparator 21 is increased by a voltage amount by offset current Ia and resistance 23d. In this case, the noninverting input terminal voltage Vb is largely raised because the output voltage Vd of D/A converter 56 is low and hence the difference $V_{DAC}$ between Vd and the reference voltage is fairly large.

After that, counter 52 is counted up in response to clock. CLK2. The output of comparator 53 is turned to "H" when the count value of counter 52 becomes equal to the output value of clamp circuit 51. Hence, counter 55 is incremented and at the same time counter 52 is cleared. By repeating this operation, comparator 53 generates the clock signal Ve as shown by the pulse waveform (d) of FIG. 2. Counter 55 counts up this clock signal Ve. In response to this counting operation by counter 55, the output voltage Vd of D/A converter 56 increases in a stepwise fashion.

With the increase of output voltage Vd, the difference $V_{DAC}$ between the reference voltage and Vd is gradually reduced. Correspondingly, the current value converted in V-I conversion circuit 6 is gradually reduced. Therefore, noninverting input terminal voltage Vb is first increased largely and is gradually reduced in a stepwise fashion as shown by the waveform (a) of FIG. 2.

Counter 55 stops the counting operation when the count value becomes a value selecting the same tap as the reference voltage, and maintains its count value. In this case, offset current Ia becomes 0 because output voltage Vd of D/A converter 56 is equal to the reference voltage. Hence, noninverting input terminal voltage Vb is equalized with input voltage Va. In other words, the increase of noninverting input terminal voltage Vb is terminated.

On the other hand, when input voltage Va reduces and crosses the level of threshold voltage Vc, the output of comparator 21 is turned from "H" to "L." In this case, analog switch 22b is turned on, and the offset current (=Ib) of V-I conversion circuit 6 flows through resistance 23e to increase the threshold voltage Vc. Furthermore, transistor 24 is turned OFF and, hence, resistance 23c is released from the shortcircuit condition. The threshold voltage Vc is increased by that amount.

Thereafter, offset current Ib gradually reduces in the same manner as described above. Hence, as shown by the waveform (b) of FIG. 2, threshold voltage Vc is first largely increased and then gradually reduced in a stepwise fashion.

As apparent from the foregoing description, the input voltage or the threshold voltage is changed in response to the change of the output voltage of comparator 21 and the voltage is sequentially reduced stepwisely. Hence, the comparator operation is accurately and stably performed without causing any generation of noise due to sudden change of voltage.

A lift-up time of the input voltage or the threshold voltage is defined as mask time $T_{MASK}$ ($T_{MASK}=k \cdot n_T / f$), where k represents an increment number in counter 55, $n_T$ represents the output value of clamp circuit 51, and f represents the period of clock CLK2. As the output value of clamp circuit 51 represents the period of the output of comparator circuit 2, mask time $T_{MASK}$ varies in proportion to the period of the output signal of comparator circuit 2. Accordingly, even if the period of the output signal of comparator circuit 2 is changed, it becomes possible to prevent the inversion timing of comparator 21 from deviating by completing the lift-up operation of the input voltage or the threshold voltage until the input voltage Va crosses the threshold voltage Vc.

A first feature of the above-described embodiment is that the circuit arrangement can be easily constituted by using a CMOS transistor. More specifically, the change of the hysteresis voltage is processed in a digital processing manner, and hence it can be easily constituted by D/A converter 56 and CMOS transistor. The output signal of the present embodiment apparatus can be sent to a CPU or a backup circuit block installed in the engine ECU to control the ignition timing. When this kind of functional block, constituting the engine ECU, is integrated into a one-chip CMOS-IC, the present embodiment apparatus can be incorporated together.

A second feature of the above-described embodiment is that this circuit arrangement is excellent in the mask time accuracy and the hysteresis voltage accuracy. As the mask time is expressed by the above-described equation, its accuracy is equivalent to the clock accuracy. In this respect, a satisfactory mask time can be easily obtained by using the clock of a crystal oscillator or the like. Especially, when the present embodiment apparatus is integrated into one-chip micro computer, it is preferable that the system clock of the CPU is divided for obtaining such an accurate clock for the mask time.

On the other hand, the hysteresis voltage depends on only the output voltage of D/A converter 56, the resistance ratio of resistances 65 to 66, the resistance ratio of resistances 67 to 23d (or 23e), the offset values of operational amplifiers 61 to 63. If the present embodiment apparatus is formed into a monolithic integrated circuit using D/A converter 56 having a resistance ladder, it will become possible to obtain an accurate hysteresis voltage not relying upon the absolute value of the resistance.

Although the above-described embodiment increases the voltage levels of both the sensor voltage side and the threshold voltage side by using the offset voltage, it will be also possible to increase only one of them.

Second Embodiment

In general, the output voltage of a sensor using an electromagnetic pickup coil has an amplitude proportional to the rotational speed of the gear. Accordingly, to increase noise durability, it is desirable to set a lower threshold voltage when the rotational speed of the gear is low and increase the threshold voltage with increasing rotational speed. In view of this, the second embodiment is characterized in that the threshold voltage, which is set for the input voltage increasing, is raised in proportion to the frequency of the input voltage.

Figure 3:
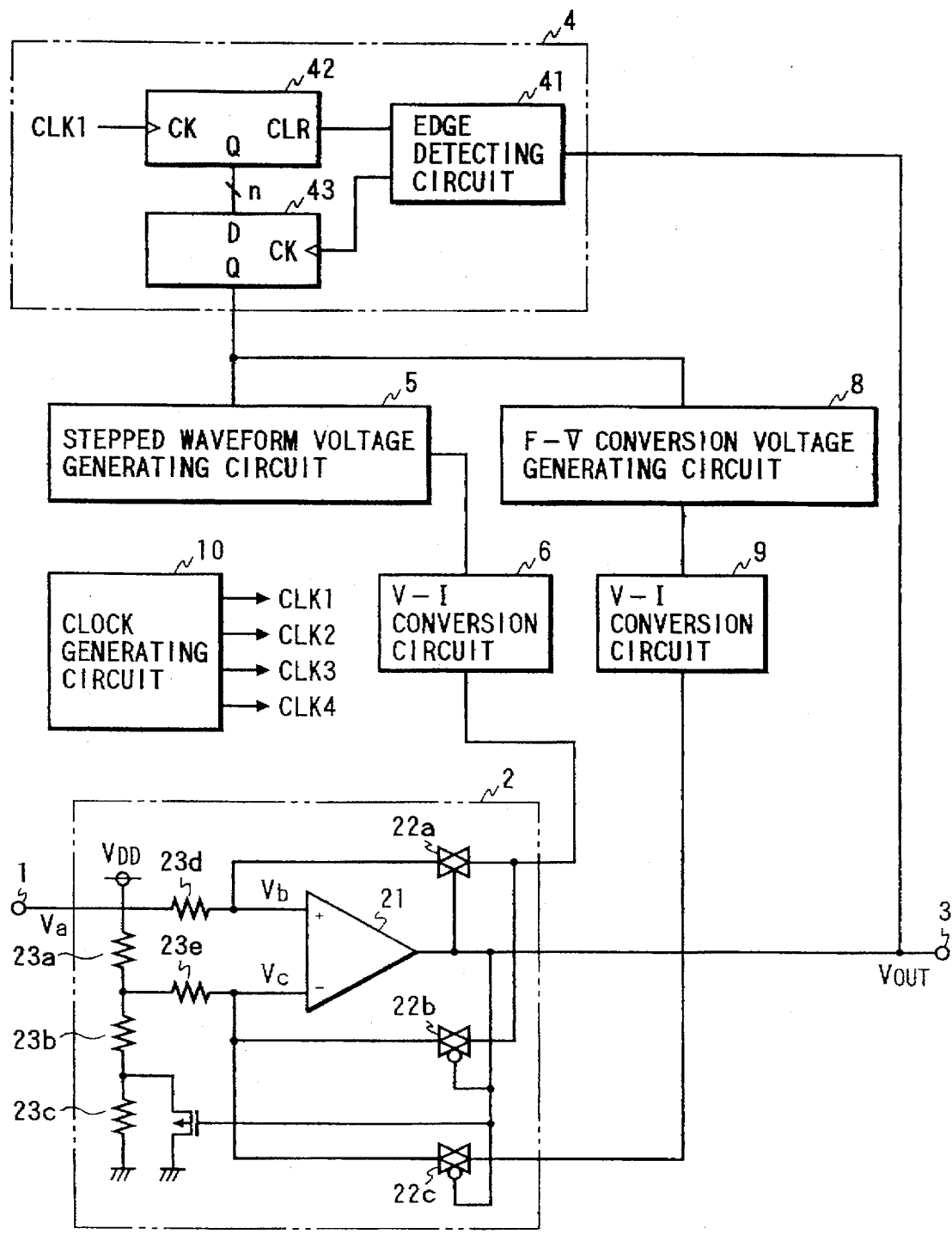
FIG. 3 is a schematic diagram showing a circuit arrangement of a second embodiment of the present invention.

For this end, as shown in FIG. 3, the second embodiment comprises an F-V conversion voltage generating circuit 8 which converts the frequency of the output signal of comparator circuit 2 into a voltage based on the period measured by period measuring circuit 4, a V-I conversion circuit 9 which converts the output voltage of F-V conversion voltage generating circuit 8 into corresponding current, and a clock generating circuit 10 which generates clocks CLK3 and CLK4 required for operating F-V conversion voltage generating circuit 8 as well as the above-described clocks CLK1 and CLK2. Comparator circuit 2 comprises an analog switch 22c which supplies the current of V-I conversion circuit 9 to resistance 23e to increase the threshold voltage.

Figure 4:
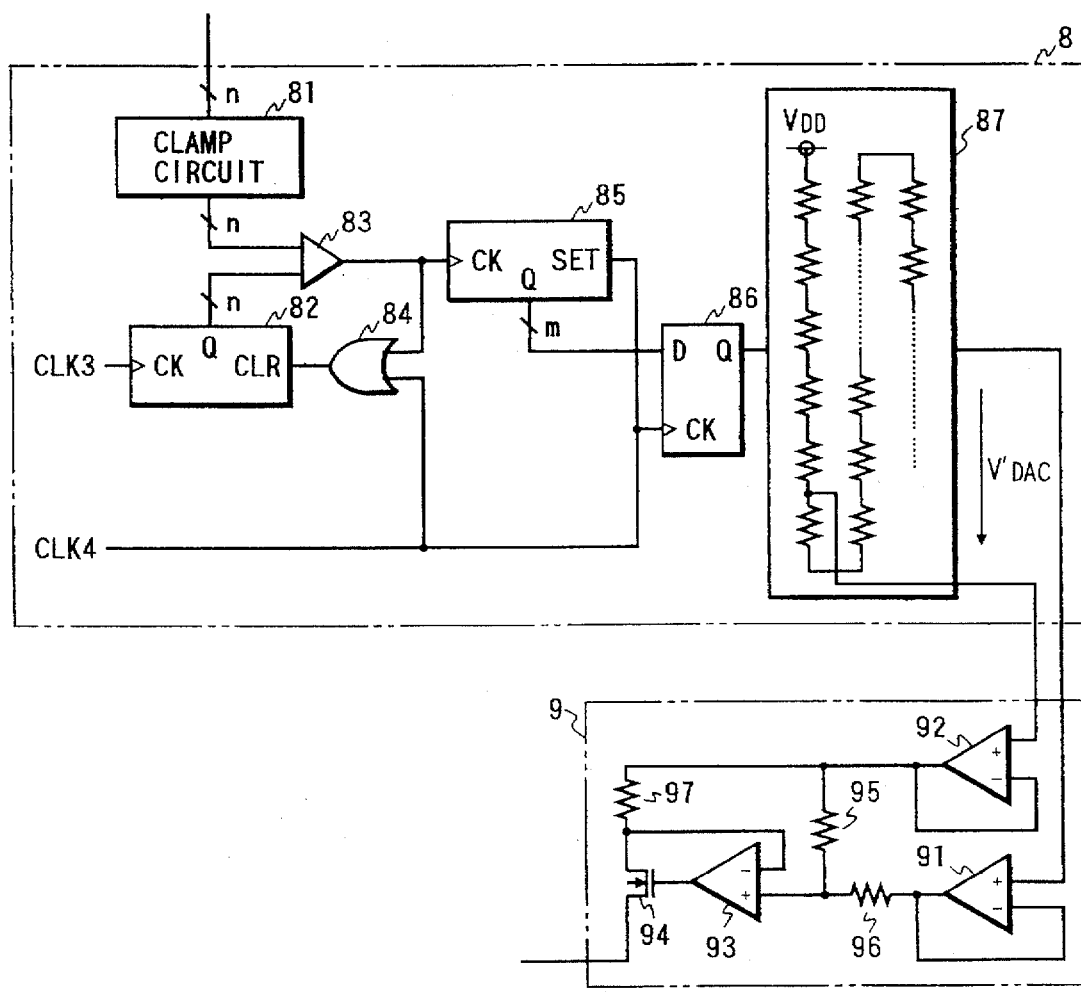
FIG. 4 is a diagram showing the details of an F-V conversion voltage generating circuit 8 and a V-I conversion circuit 9 shown in FIG. 3.

FIG. 4 shows the details of F-V conversion voltage generating circuit 8 and V-I conversion circuit 9. A clamp circuit 81 clamps the count value held by D-F/F 43 of period measuring circuit 4 in a given range defined by predetermined upper-limit and lower-limit values. This clamp circuit 81 is used for the same purpose as clamp circuit 51, but is separately provided because their clamping frequencies are different from each other. It is needless to say that, if their clamping frequencies are identical, clamp 51 will be commonly used and clamp 81 can be omitted.

The output of clamp circuit 81 is converted into a clock signal through a digital comparator 83, a counter 82, and an OR circuit 84. This operation is similar to the operation by the comparator 53, counter 52, and OR circuit 54 in the stepped waveform voltage generating circuit 5. Counter 82 performs the counting operation in response to the clock CLK3 supplied from clock generating circuit 10.

A down counter 85 is set by clock CLK4 fed from clock generating circuit 10, and starts the down-counting operation from the value being set by clock CLK4 by responding to each of the clock signal fed from comparator 83. The down count value is held in a D-F/F 86 of m bit, and is then converted into a voltage by a D/A converter 87 of a resistance ladder.

D/A converter 87 not only converts the down count value into a corresponding voltage but generate a reference voltage taken out from a stationary tap in the ladder resistance. This operation is similar to that of D/A converter 56 of FIG. 1.

The voltage, once converted in D/A converter 87, is further converted into corresponding current in the V-I conversion circuit 9. Components 91 through 97 in this V-I conversion circuit 9 are identical with the components 61 through 67 in the V-I conversion circuit 6 in FIG. 1. The operation of the above-described circuit will be explained with reference to the timing chart shown in FIG. 5.

D-F/F 43 of period measuring circuit 4 maintains the count value of each cycle of the output signal of comparator circuit 2. As shown by the waveform (a) of FIG. 5, the count values of consecutive periods are expressed by n1, n2 . . . . , n5. The count value held by D-F/F 43 is clamped in the predetermined range by clamp circuit 81. The output of clamp circuit 81 is entered into a comparator 83.

Counter 82 counts clock CLK3 fed from clock generating circuit 10. Every time the count value of counter 82 reaches the output value of clamp circuit 8, comparator 83 generates a clock signal which is shown by the pulse waveform (b) of FIG. 5.

Figure 5:
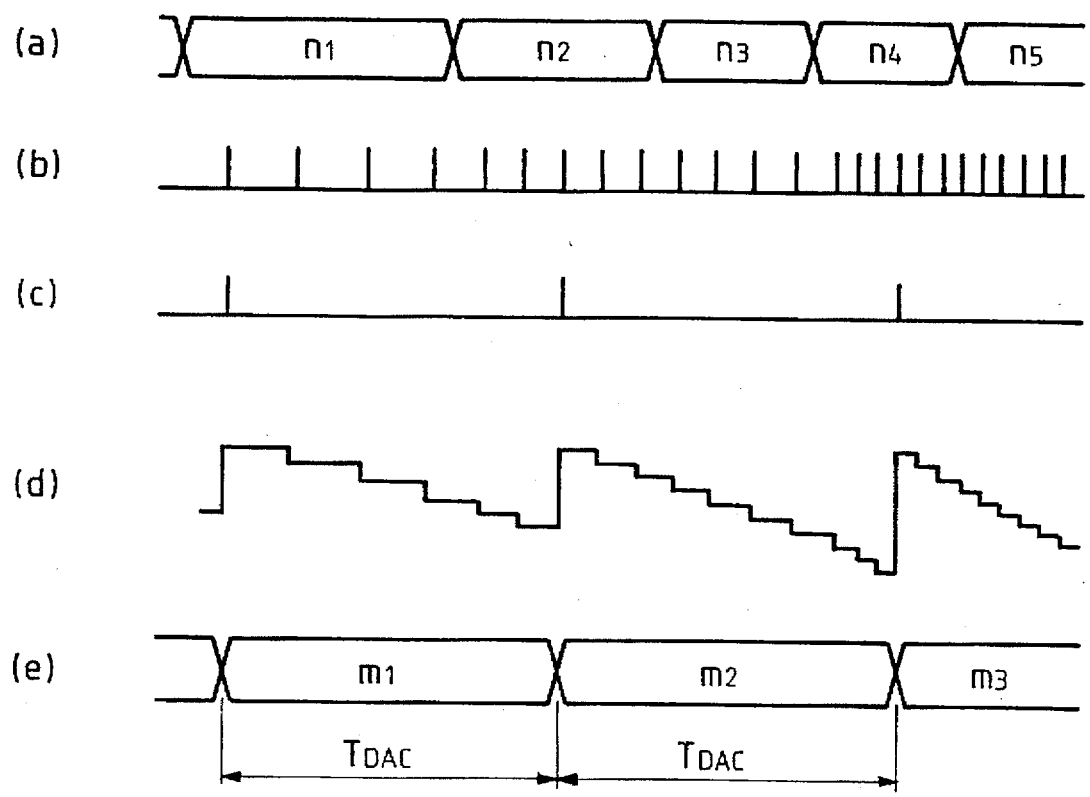
FIG. 5 is a timing chart showing an operation of the circuit shown in FIG. 4.

Down counter 85 is set at predetermined intervals in synchronism with the timing of clock CLK4 fed form clock generating circuit 10 as shown by the pulse waveform (c) of FIG. 5, and performs the down-counting operation from its set value in response to the clock signal.

The count value of down counter 85 is held in D-F/F 86 in response to the clock CLK4 fed from clock generating circuit 10. Immediately after that, counter 82 is cleared while the down counter 85 is set.

Accordingly, the count value of down counter 85 varies as shown by the waveform (d) of FIG. 5. Meanwhile, the count value held in D-F/F 86 is sequentially changed from m1 to m2, and further from m2 to m3 as shown by the waveform (e) of FIG. 5.

The count value held in D-F/F 86 is converted into corresponding voltage in D/A converter 87. In this case, a voltage (V'$_{DAC}$), obtained by subtracting the converted voltage from the reference voltage, is in a pseudo inverse proportional relationship to the period of the output signal of comparator circuit 2. In other words, the voltage (V'$_{DAC}$) is in a pseudo proportional relationship to the frequency of the output signal of comparator circuit 2, thereby performing the F-V conversion.

The voltage (V'$_{DAC}$) is converted into corresponding current in V-I conversion circuit 9. When the sensor signal is lower than the threshold voltage, analog switch 22c is turned ON and the current of V-I conversion circuit 9 flows through resistance 23e. Hence, the threshold voltage Vc is raised. In this case, the threshold voltage can be raised with increasing frequency of the output signal of comparator circuit 2, improving the noise durability.

Furthermore, the period of the clock signal entered into down counter 85 is determined by the momentary period of the output signal of comparator circuit 2. The value of down counter 85 is entered in D-F/F 86 every period T$_{DAC}$ of clock CLK4 as shown by the waveform (e) of FIG. 5. Accordingly, the value taken in D-F/F 86 reflects the mean value of the period of the output signal from comparator circuit 2 during the period T$_{DAC}$.

Moreover, the delay time in the change of threshold voltage in accordance with the frequency change of the output signal of comparator circuit 2 is T$_{DAC}$ at maximum. Hence, the delay time can be reduced by minimizing the value of T$_{DAC}$.

Third Embodiment

Figure 6:
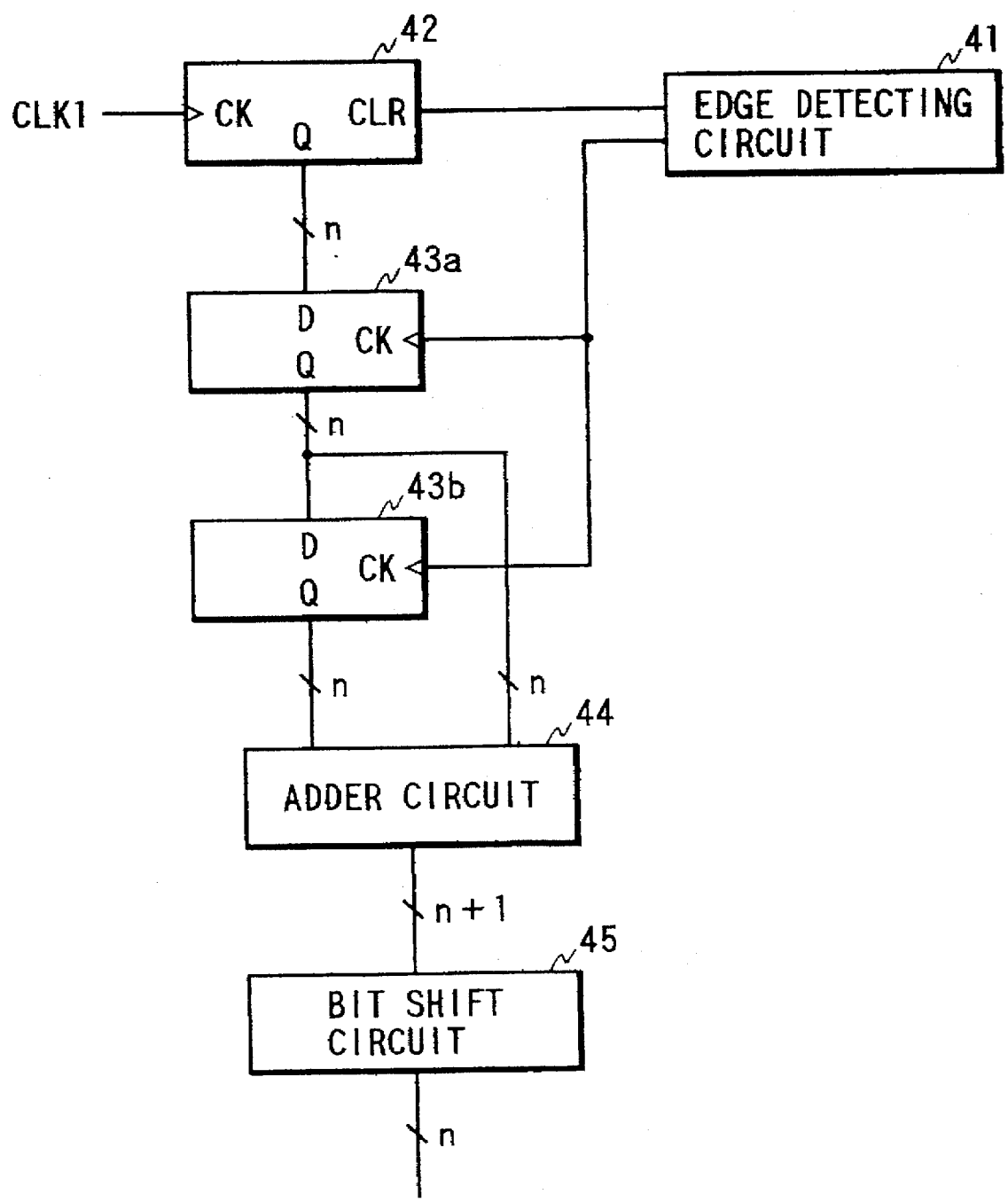
FIG. 6 is a schematic block diagram showing an essential part of a third embodiment of the present invention.

FIG. 6 shows another embodiment of period measuring circuit 4. The period measuring circuit 4 shown in FIGS. 1 and 3 holds the count value of counter 42 in the D-F/F 43 before output this value.

However, when the engine speed is low, the amplitude of the sensor signal is so small that a significant dispersion may be caused in the period. More specifically, the period of the sensor signal is gradually changed as a whole with increasing speed of the engine, but individual values of the period possibly cause a large dispersion.

In the digital circuit arrangement shown in FIG. 1 or 3, the input voltage or the threshold voltage varies with good response in response to the momentary output signal of comparator circuit 2. Hence, there is a problem that the input voltage or the threshold voltage may vary so largely due to such dispersion of the period that adverse effect is given to the operation.

In view of the above, the third embodiment is characterized in that the count value generated from period measuring circuit 4 is a mean value of the present and previous count values, thereby absorbing the dispersion of the period detected in the low engine speed region.

For this end, as shown in FIG. 6, there are provided two D-F/F 43a and 43b, an adder circuit 44 and a bit shift circuit 45.

When the edge detecting circuit 41 detects the edge, the previous count value of counter 42, held in D-F/F 43a, is shifted to D-F/F 43b, while the present count value of counter 42 is held in D-F/F 43a. The count values held in D-F/F 43a and 43b are summed in adder circuit 44. This added value is then entered into bit shift circuit 45 to shift its value by 1 bit toward the LSB side. Through this 1 bit shift operation, the added value is divided by 2, thereby accomplishing the averaging operation. As a result, bit shift circuit 45 generates a mean count value of the previous count value and the present count value.

The averaging operation of the count value can be performed by using numerous count values more than two.

Fourth Embodiment

Figure 7:
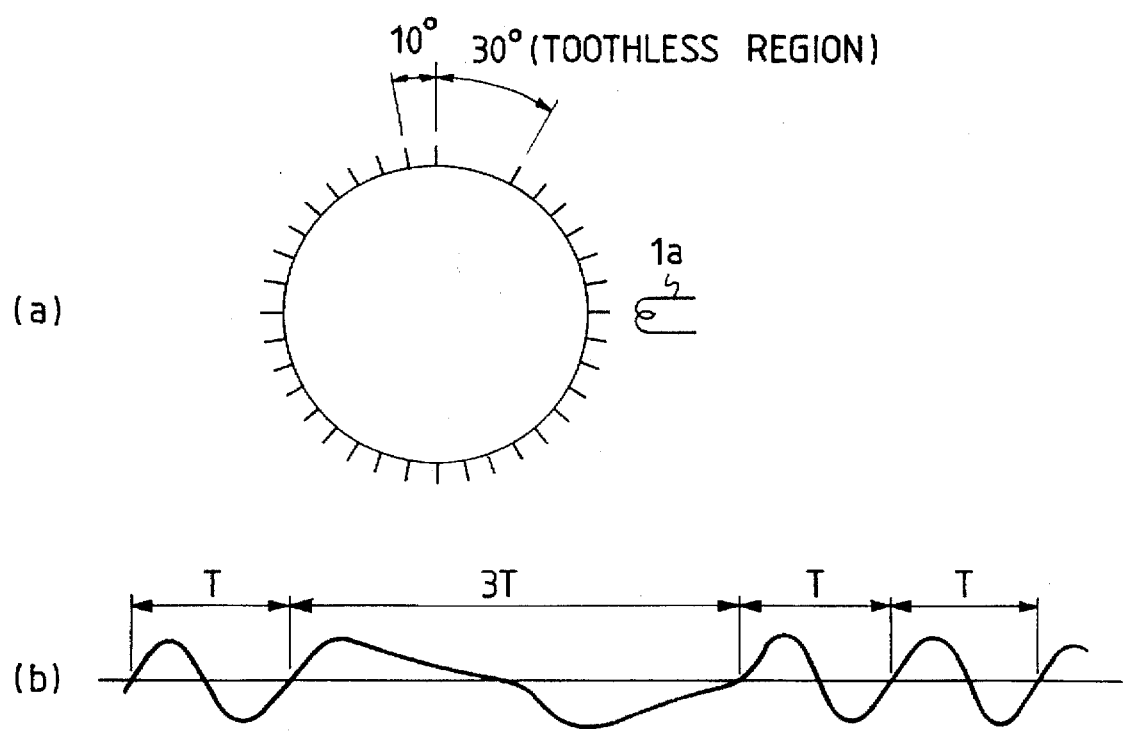
FIG. 7 is a composite view showing a schematic arrangement of a sensor and a waveform of a sensor signal.

The above-described sensor generally comprises a pickup coil 1a disposed in confronting relationship with the gear teeth as shown by the waveform (a) of FIG. 7, so that it can generate sensor signals in response to the rotation of the gear. In this case, if the gear has a toothless region, the period of the sensor signal will be varied in this toothless region as shown by the waveform (b) of FIG. 7. For example, it is assumed that there is formed a toothless region of 30° when teeth are disposed at regular intervals of 10°. In this case, the period of the sensor signal in the toothless region will be extended to three times of the regular period.

Such a variation of the period in the sensor signal, caused by the presence of the toothless region, will cause a problem that, in the digital circuits of FIGS. 1 and 3, the input voltage or the threshold voltage will largely deviate from the inherent values thereof.

Figure 8:
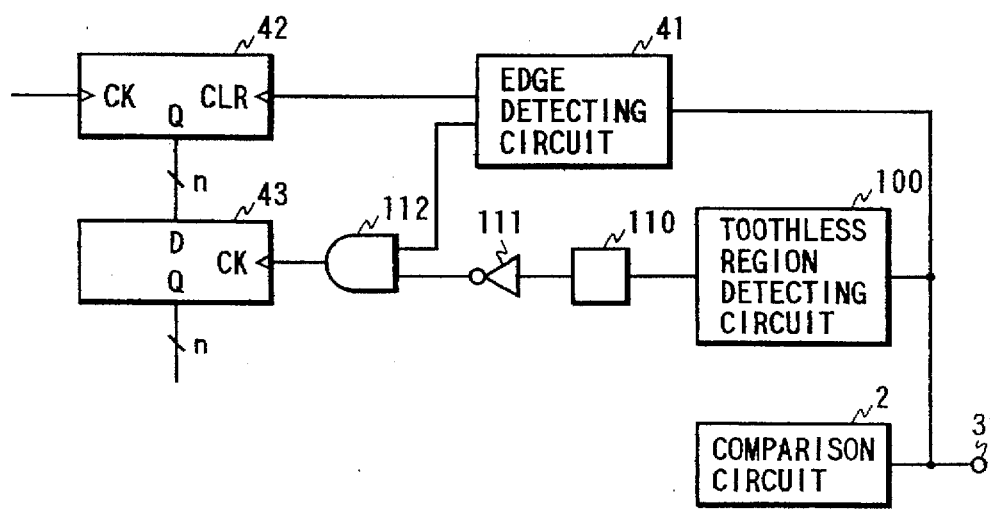
FIG. 8 is a schematic block diagram showing an essential part of a fourth embodiment of the present invention.

In view of the above, the fourth embodiment of the present invention employs the circuit arrangement of FIG. 8 wherein the previous count value of counter 42 in the period measuring circuit 4 is specially used in the event of detection of the toothless region, instead of using the momentary count value of counter 42.

For this end, there is provided a toothless region detecting circuit 100 for detecting the toothless region from the output signal of comparator circuit 2. This toothless region detecting circuit 100 generates a toothless region detection signal of "H" when the toothless region is detected. This toothless region detecting signal is delayed in a delay circuit 110 and then inverted in an inverter 111, and is thereafter entered into an AND circuit 11.

Accordingly, when the toothless region detecting circuit 100 detects the toothless region, the clock signal sent from edge detecting circuit 41 to D-F/F 43 is masked by the toothless region detecting signal. Hence, D-F/F 43 does not newly hold the momentary count value of counter 42, instead continuously holding the previous count value. Counter 43 is cleared by edge detecting circuit 41 even in the duration of this masking operation; therefore, the next counting operation is started.

Figure 9:
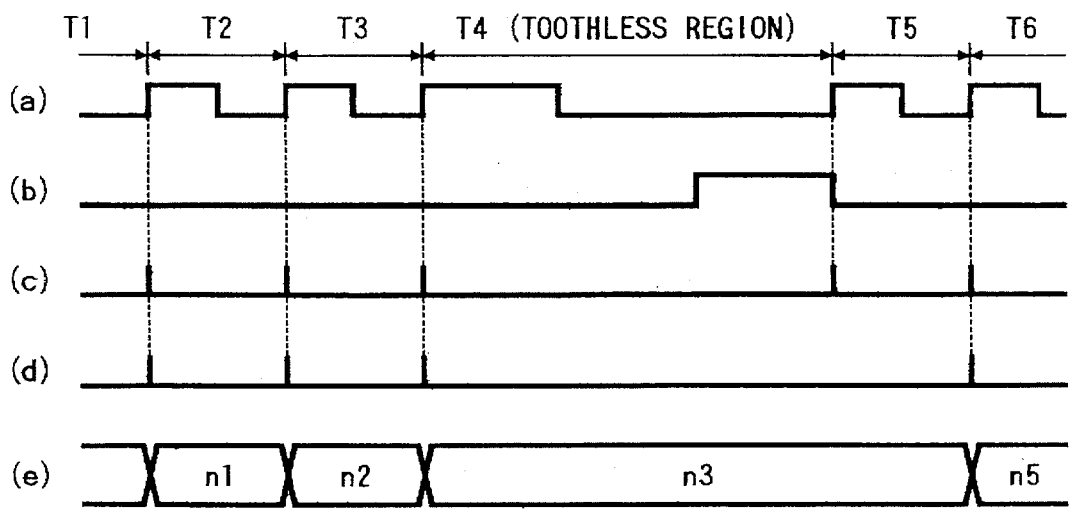
FIG. 9 is a timing chart showing an operation of the circuit shown in FIG. 8.

The operation of the above-described circuit will be explained with reference to FIG. 9, wherein the waveform (a) represents the output signal of comparator circuit 2, the waveform (b) represents the output signal of toothless detecting circuit 100, the waveform (c) represents the output signal of edge detecting circuit 41, the waveform (d) represents a clock signal entered into D-F/F 43, and the waveform (e) represents the data held in D-F/F 43.

As shown in this timing chart, once the toothless region detecting circuit 100 detects the toothless region, the toothless region detecting signal of "H" level is continuously generated until the output signal of comparator circuit 2 builds up. On the other hand, the clock signal is generated from edge detecting circuit 41 in response to the build-up of the output signal of comparator circuit 2. Therefore, the toothless region detecting signal of toothless region detecting circuit 100 is delayed in delay circuit 110 to surely mask the clock signal.

Figure 10:
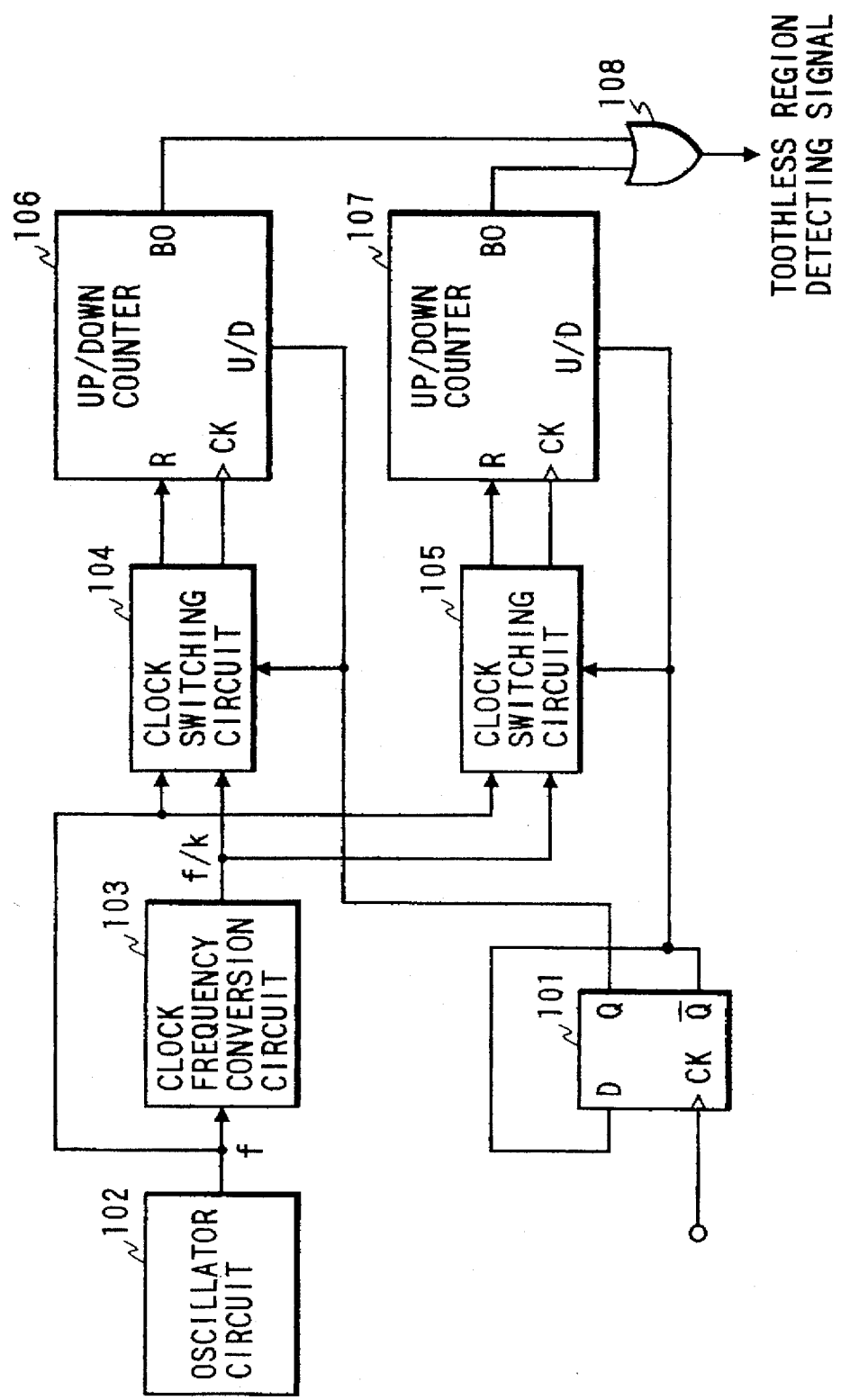
FIG. 10 is a diagram showing the details of a toothless region detecting circuit 100 shown in FIG. 8.

The detailed arrangement of toothless region detecting circuit 100 will be explained with reference to FIG. 10. The operation of various portions will be explained with reference to the timing chart of FIG. 11.

The output signal of comparator circuit 2 is entered into a D-F/F 101. The output of D-F/F 101 varies in response to the rising edge of the output signal of comparator circuit 2, as shown by the waveform (a) of FIG. 11.

Furthermore, an oscillator circuit 102 generates a clock signal of frequency f (e.g. 8-KHz). A clock frequency conversion circuit 103 generates a clock signal of frequency f/k, where k is an arbitrary value such as 2, 2.2, 2.4 etc. The timing chart of FIG. 11 is k=2. The clock signal of frequency f is used for the up-counting operation, while the clock signal of frequency f/k is used for the down-counting operation.

Clock switching circuits 104 and 105 cooperatively selects the clock signal between the clock signal of frequency f and the clock signal of frequency f/k based on the output of D-F/F 101. In this case, the signal level generated from D-F/F 101 to clock switching circuit 104 is different from the signal level generated from D-F/F 101 to clock switching circuit 105. Hence, when either one of these two clock switching circuits generates the clock signal of frequency f, the other clock switching circuit generates the clock signal of frequency f/k. Each clock switching circuit generates a reset signal for resetting the up/down counters at the timing the output clock signal is switched from frequency f/k to f.

Up/down counters 106 and 107 perform the up/down counting operation of clock signals generated from clock switching circuits 104 and 105. Selection between the up-count operation or the down-count operation is determined by the output of D-F/F 101. When the clock signal of frequency f is generated from the clock switching circuit, the up-count operation is performed. On the other hand, when the clock signal of frequency f/k is generated from the clock switching circuit, the down-count operation is performed.

Accordingly, up/down counters 106 and 107 performs the up-count operation and the down-count operation at different timings in response to the rising edge of the output signal of comparator circuit 2. With this arrangement, even if one of the up/down counters fails to detect the toothless region, it will be possible to detect the toothless region by the other up/down counter, thereby surely performing the detection of the toothless region. The waveform (b) of FIG. 11 shows the change of the count value of one of the up/down counters.

In this case, as shown in FIG. 11, the down-count value becomes 0 when the period is elongated by the detection of the toothless region. Thus, a High-level signal is generated from a BO terminal of the up/down counter. In response to this High-level output, the toothless region detecting signal is generated through OR circuit 108 as shown by the waveform (c) of FIG. 11.

The toothless region detecting circuit and others disclosed in this fourth embodiment can be applied to the third embodiment shown in FIG. 6.

As this invention may be embodied in several forms without departing from the spirit of essential characteristics thereof, the present embodiments described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A waveform shaping apparatus comprising:
a comparing means for comparing a sensor signal with a threshold signal to generate an output signal whose waveform is shaped;
a clock signal generating means for generating a clock signal having a period proportional to a period of the output signal of said comparing means;
a counting means, initialized in synchronism with a change of the output signal of said comparing means, for performing a counting operation of said clock signal generated from said clock signal generating means; and
an offset means for producing an offset signal attenuating in a stepwise fashion from a predetermined signal level in accordance with the counting operation of said counting means, and adding said offset signal to either said sensor signal or said threshold Signal when said sensor signal crosses a signal level of said threshold signal, so as to increase a difference between a level of said sensor signal and a level of said threshold signal.

2. The waveform shaping apparatus in accordance with claim 1, wherein said offset means comprises a voltage conversion means for converting a count value of said counting means into corresponding voltage, to produce said offset signal based on said corresponding voltage.

3. The waveform shaping apparatus in accordance with claim 1, wherein said clock signal generating means comprises a period measuring means for measuring the period of said output signal of said comparing means, and a dividing means for generating said clock signal by dividing a reference clock based on said period measured by said period measuring means.

4. The waveform shaping apparatus in accordance with claim 3, wherein said period measuring means comprises an edge detecting means for detecting an edge of the output signal of said comparing means, and a time measuring means for measuring a time interval between a previous edge detecting time and a present edge detecting time in response to each edge detection by said edge detecting means.

5. The waveform shaping apparatus in accordance with claim 4, wherein said period measuring means further comprises an average output means for averaging a plurality of latest measuring data measured by said time measuring means to generate said measured period.

6. The waveform shaping apparatus in accordance with claim 3, further comprising a frequency-voltage conversion means for generating a voltage corresponding to a frequency of the output signal of said comparing means based on said measured period, and a threshold signal changing means for increasing the signal level of said threshold signal by the voltage corresponding to the frequency when the level of said sensor signal is lower than the level of said threshold signal.

7. The waveform shaping apparatus in accordance with claim 3, wherein said sensor signal is generated in response to a rotation of a toothed gear, a toothless region detecting means is provided for detecting a toothless region of said toothed gear based on the output signal of said comparing means, and a prohibiting means is provided for prohibiting a renewal of said measured period based on a momentary output of said comparing means when said toothless region is detected by said toothless region detecting means.

8. A waveform shaping apparatus comprising:
  a comparing means for comparing a sensor signal with a threshold signal to generate an output signal whose waveform is shaped;
  a clock signal generating means for generating a clock signal having a period proportional to the output signal of said comparing means;
  a counting means, initialized in synchronism with a change of the output signal of said comparing means, for performing a counting operation of said clock signal generated from said clock signal generating means; and
  an offset means for producing an offset signal varying in a stepwise fashion from a predetermined signal level in accordance with the counting operation of said counting means, and increasing a signal level of said sensor signal when said sensor signal exceeds said threshold signal while increasing a signal level of said threshold signal when said sensor signal falls below said threshold signal.

9. The waveform shaping apparatus in accordance with claim 8, wherein said offset means comprises a voltage conversion means for converting a count value of said counting means into corresponding voltage, to produce said offset signal based on said corresponding voltage.

10. The waveform shaping apparatus in accordance with claim 8, wherein said clock signal generating means comprises a period measuring means for measuring the period of said output signal of said comparing means, and a dividing means for generating said clock signal by dividing a reference clock based on said period measured by said period measuring means.

11. The waveform shaping apparatus in accordance with claim 10, wherein said period measuring means comprises an edge detecting means for detecting an edge of the output signal of said comparing means, and a time measuring means for measuring a time interval between a previous edge detecting time and a present edge detecting time in response to each edge detection by said edge detecting means.

12. The waveform shaping apparatus in accordance with claim 11, wherein said period measuring means further comprises an average output means for averaging a plurality of latest measuring data measured by said time measuring means to generate said measured period.

13. The waveform shaping apparatus in accordance with claim 10, further comprising a frequency-voltage conversion means for generating a voltage corresponding to a frequency of the output signal of said comparing means based on said measured period, and a threshold signal changing means for increasing the signal level of said threshold signal by the voltage corresponding to the frequency when the level of said sensor signal is lower than the level of said threshold signal.

14. The waveform shaping apparatus in accordance with claim 10, wherein said sensor signal is generated in response to a rotation of a toothed gear, a toothless region detecting means is provided for detecting a toothless region of said toothed gear based on the output signal of said comparing means, and a prohibiting means is provided for prohibiting a renewal of said measured period based on a momentary output of said comparing means when said toothless region is detected by said toothless region detecting means.

15. A waveform shaping apparatus comprising:
  a comparing means for comparing a sensor signal with a threshold signal to generate an output signal whose waveform is shaped;
  a period measuring means for measuring a period of the output signal of said comparing means to generate a measured period; and
  an offset means for producing an offset signal attenuating in a stepwise fashion, the time of each step being proportional to the measured period of said output signal of said comparing means, so as to decrease from a predetermined signal level which is set in synchronism with a change of the output signal of said comparing means, and adding said offset signal to either said sensor signal or said threshold signal when said sensor signal crosses a signal level of said threshold signal, so as to increase a difference between said sensor signal and said threshold signal.

16. The waveform shaping apparatus in accordance with claim 15, wherein said period measuring means comprises an edge detecting means for detecting an edge of the output signal of said comparing means, and a time measuring means for measuring a time interval between a previous edge detecting time and a present edge detecting time in response to each edge detection by said edge detecting means.

17. The waveform shaping apparatus in accordance with claim 16, wherein said period measuring means further comprises an average output means for averaging a plurality of latest measuring data measured by said time measuring means to generate said measured period.

18. The waveform shaping apparatus in accordance with claim 15, further comprising a frequency-voltage conversion means for generating a voltage corresponding to a frequency of the output signal of said comparing means based on said measured period, and a threshold signal changing means for increasing the signal level of said threshold signal by the voltage corresponding to the frequency when the level of said sensor signal is lower than the level of said threshold signal.

19. The waveform shaping apparatus in accordance with claim 15, wherein said sensor signal is generated in response to a rotation of a toothed gear, a toothless region detecting means is provided for detecting a toothless region of said toothed gear based on the output signal of said comparing means, and a prohibiting means is provided for prohibiting a renewal of said measured period based on a momentary output of said comparing means when said toothless region is detected by said toothless region detecting means.

* * * * *